(12) United States Patent  (10) Patent No.: US 8,581,310 B2
Wan et al.  (45) Date of Patent: Nov. 12, 2013

(54) Z²FET FIELD-EFFECT TRANSISTOR WITH A VERTICAL SUBTHRESHOLD SLOPE AND WITH NO IMPACT IONIZATION

(75) Inventors: Jing Wan, Grenoble (FR); Sorin Cristoloveanu, Seyssinet Pariset (FR); Cyrille Le Royer, Tullins-Fures (FR); Alexander Zaslavsky, Providence, RI (US)

(73) Assignees: Commissariat a l'Energie Atomique et aux Energies Alternatives, Paris (FR); Centre Nationale de la Recherche Scientifique, Paris (FR)

( * ) Notice: Subject to any disclaimer, the term of this patent is extended or adjusted under 35 U.S.C. 154(b) by 0 days.

(21) Appl. No.: 13/611,841

(22) Filed: Sep. 12, 2012

(65) Prior Publication Data

US 2013/0069122 A1    Mar. 21, 2013

(30) Foreign Application Priority Data

Sep. 12, 2011 (FR) ...................... 11 02747

(51) Int. Cl.
*H01L 29/80* (2006.01)
(52) U.S. Cl.
USPC .................... 257/256; 257/255; 257/E27.148
(58) Field of Classification Search
USPC ................................. 257/256, 255, E27.148
See application file for complete search history.

(56) References Cited

U.S. PATENT DOCUMENTS

| | | | |
|---|---|---|---|
| 8,017,981 B2 * | 9/2011 | Sankin et al. ................. | 257/265 |
| 2006/0113612 A1 | 6/2006 | Gopalakrishnan et al. | |
| 2006/0220086 A1 * | 10/2006 | Charbuillet et al. .......... | 257/296 |
| 2009/0001472 A1 | 1/2009 | Salman et al. | |
| 2012/0115297 A1 * | 5/2012 | Huang et al. .................. | 438/294 |

FOREIGN PATENT DOCUMENTS

EP    1 901 354 A1    3/2008

OTHER PUBLICATIONS

Padilla et al., "Feedback FET: A Novel Transistor Exhibiting Steep Switching Behavior at Low Bias Voltages," IEEE International Electron Devices Meeting, 2008, pp. 1-4.
Manavizadeh et al., "A Comprehensive Study of Nanoscale Field Effect Diodes," Thermal, Mechanical and Multi-Physics Simulation and Experiments in Microelectronics and Microsystems, EuroSimE, 2011, pp. 1-4.

* cited by examiner

*Primary Examiner* — Timor Karimy
(74) *Attorney, Agent, or Firm* — Oliff & Berridge, PLC

(57) ABSTRACT

The transistor comprises first and second source/drain electrodes formed in a semiconductor film by N-doped and P-doped areas, respectively. A polarization voltage is applied between the two source/drain electrodes in order to impose to the P-doped electrode a potential higher than that of the N-doped electrode. The transistor comprises first and second devices for generating a potential barrier in the semiconductor film. The two potential barriers are opposed to the passage of the charge carriers emitted by the first and second source/drain electrodes, respectively. The two potential barriers are shifted with respect to an axis connecting the two source/drain electrodes. The two devices for generating a potential barrier are configured to generate a potential barrier having a variable amplitude and it are electrically connected to the gate and to the counter electrode.

7 Claims, 4 Drawing Sheets

Z²FET FIELD-EFFECT TRANSISTOR WITH A VERTICAL SUBTHRESHOLD SLOPE AND WITH NO IMPACT IONIZATION

TECHNICAL FIELD OF THE INVENTION

The invention relates to a field-effect transistor.

STATE OF THE ART

Progressively with the technological developments, the level of integration in integrated circuits has become higher and higher in a continuous way, which enables to incorporate a more and more significant number of electronic functions for a given silicon surface. However, the power consumption of the electronic circuits has also strongly increased and the power consumption of the integrated circuit has become a new point of concern for the technological nodes to come, in particular in mobile applications. In addition to further increase the level of integration for the future technological nodes, it is important that we concentrate on means for controlling the power dissipated by the circuit.

The power dissipated in the circuit comprises a dynamic component which comes from the switching of the transistors between their on- and off-states. The dissipated power also comprises a static component which is related to leakages in the transistor when the latter is in an off-state. Because of the continuous reduction of the transistor sizes and the supply voltages, a great part of the dynamic consumption of the transistors is due to the consumption caused by subthreshold leaks which is a parameter subjected to physical considerations which cannot be circumvented with the result that the value of the subthreshold slope cannot exceed a limiting value.

It is then necessary to find solutions allowing to reduce the dissipation of power in an electronic circuit.

Publication of Alvaro Padilla et al. describes a junction of PN type associated to two adjacent gate electrodes. Electric charges are trapped inside the spacers.

The publication of Manavizadel et al. describes a device having a diode associated to two adjacent gate electrodes.

OBJECT OF THE INVENTION

It is noted that there is a need for a compact field-effect transistor whose consumption is reduced. To this end, the objective is a field-effect transistor according to the annexed claims.

BRIEF DESCRIPTION OF THE DRAWINGS

Other advantages and features will more clearly arise from the following description of particular embodiments of the invention given as nonrestrictive examples and represented in the annexed drawings, in which.

DESCRIPTION OF A PREFERENTIAL EMBODIMENT OF THE INVENTION

Figure 1:
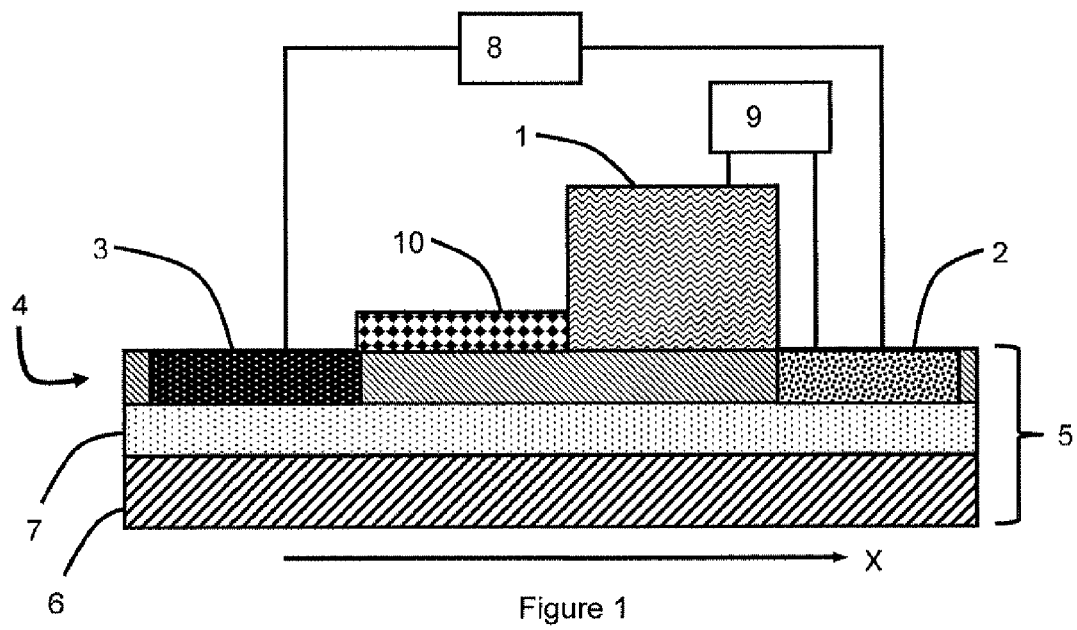
FIGS. 1 to 5 represent, in a schematic way, transversal cross-sections of various embodiments of a transistor with a vertical subthreshold slope.

As illustrated in FIG. 1, the transistor comprises a gate electrode 1, a first source/drain electrode 2 and a second source/drain electrode 3. The transistor is made on a semiconductor film 4, in a preferential way on a substrate of semiconductor on insulator 5 type comprising a support substrate 6, an electrically insulating layer 7 and the semiconductor film 4. The support substrate 6 is separated from the semiconductor film 4 by the electrically insulating layer 7.

The gate electrode 1 is separated from the semiconductor film 4 by a dielectric gate material (not represented) which is an electrically insulating material. The gate electrode 1 is formed by an electrically conducting material which allows an electrostatic effect on the semiconductor film 4. The first and second source/drain electrodes 2 and 3 are formed in the semiconductor film 4 and they are separated by an inter-electrode area made from the semiconductor film 4.

The inter-electrode area is an area of the film 4 which advantageously presents at least one portion having a doping level lower than the doping levels of the source/drain electrodes 2 and 3. Preferably, the inter-electrode area is a non-intentionally doped (nid) area, for example a volume of the film 4 with a P- or N-doping level of about $10^{14}$ at/cm³. Alternatively, it is also possible to have an more doped inter-electrode area, for example with doping levels of about $10^{16}$ or $10^{17}$ at/cm³.

In a particular embodiment illustrated in FIG. 1, the inter-electrode area is a slightly doped area with a uniform doping level from the first electrode 2 to the second electrode 3. This embodiment allows to obtain a good mobility in the conduction channel connecting the two source/drain electrodes 2 and 3.

In the semiconductor film 4, the source and drain electrodes are separated by a conduction channel which is disposed directly under the gate electrode 1. The film 4 is advantageously a single-crystal film to ensure good electric performances.

In some embodiments in which the transistor is made with other active devices on the semiconductor film 4, the transistor is electrically insulated from the rest of the substrate by means of an insulation pattern (not represented). The insulation pattern is made of an electrically insulating material surrounding the transistor. The insulation pattern is inserted in the semiconductor film 4. It can be also inserted in the electrically insulating layer 7 and the support substrate 6.

The first source/drain electrode 2 is formed in the semiconductor film 4 by a first doped area of a first type of conductivity. The second source/drain electrode 3 is formed in the semiconductor film 4 by a second doped area of a second type of conductivity opposite the first type of conductivity. The two source/drain electrodes are formed in the semiconductor film 4 and they are shifted from one another in order to be separated by the inter-electrode area. For example, the first source/drain electrode 2 is N-doped and the second source/drain electrode is P-doped. The opposite configuration is also possible.

In a general way, there are thus a N-doped source/drain electrode and another P-doped source/drain electrode. As an example, in a semiconductor layer of the group IV, for example out of silicon, germanium or a silicon-germanium alloy, the N-doping is obtained by incorporating arsenic or phosphorus. The P-doping is obtained for example by incorporating boron or indium. Other semiconductor materials are possible such as so-called III-V or II-VI materials.

In the transistor, there is schematically a PN-type diode which is formed by the two source/drain electrodes which are two oppositely doped electrodes. As the first source/drain electrode 2 is not in direct contact with the second source/drain electrode 3, the structure is not exactly that of a PN diode. If the inter-electrode area is not doped or is not intentionally doped, the structure of the diode can be comparable with a diode of the PIN type disposed in the semiconductor film 4. The PIN diode is formed by the two source/drain electrodes 2 and 3 and by the inter-electrode area. If the inter-electrode area is doped, a little more complex structure is obtained. The inter-electrode area is partly covered by the gate electrode 1.

The field-effect transistor also comprises a biasing circuit 8 configured for biasing the first source/drain electrode 2 with respect to the second source/drain electrode 3 in order to apply a first potential difference between the two source/drain electrodes. The biasing circuit 8 is configured so as to forward biasing the diode defined by the two source/drain electrodes, i.e. the device comprises means for applying a higher potential to the P-doped electrode than to the N-doped electrode.

In other words, the biasing circuit 8 is configured so that the potential applied to the P-doped electrode is higher than the potential applied to the N-type electrode.

The bias applied to the two source/drain electrodes results in reducing the amplitude of the potential barrier existing in the valence and conduction bands (in the absence of bias), which also results in the appearance of a current of charge carriers between the two source/drain electrodes.

The device can function by enrichment or depletion. For clarity reasons, only one operating mode is described but the person skilled in the art will understand that the device can be transformed to implement the other operating mode.

Figure 6:
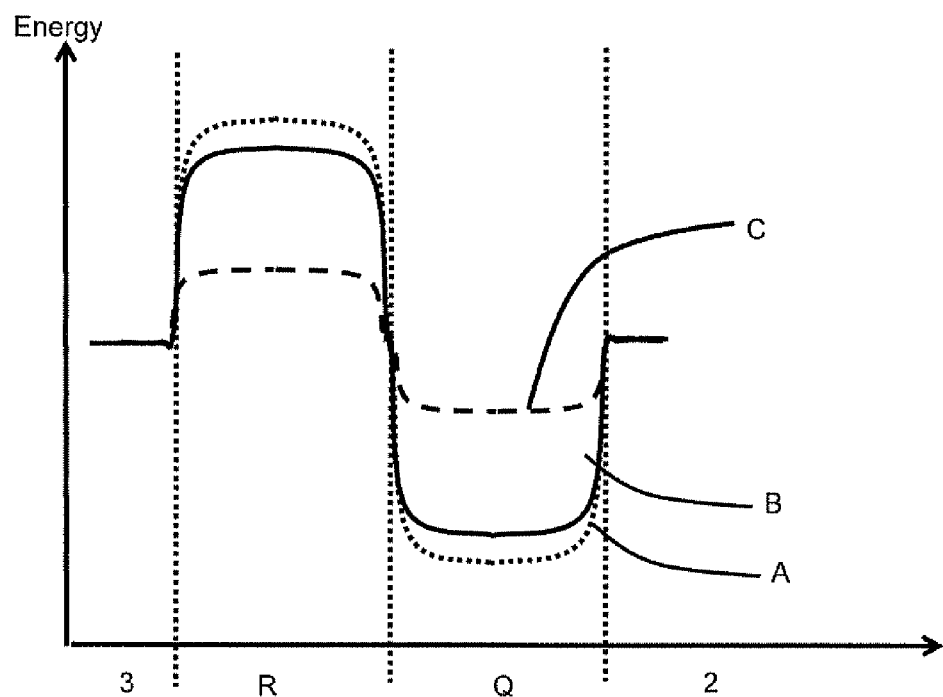
FIGS. 6 and 7 represent, in a schematic way, the band diagrams of a transistor subjected to various bias voltage and the current circulating in the transistor according to the bias voltage of the gate electrode.

The field-effect transistor comprises a first device for generating a first potential barrier Q in the semiconductor film 4 and a second device for generating a second potential barrier R in the semiconductor film 4 (FIG. 6). The first and second potential barriers are laterally shifted from one another, i.e. they are disposed in "series" in a direction X which connects the first source/drain electrode 2 to the second source/drain electrode 3. The first potential barrier Q is disposed adjacent to the first source/drain electrode 2 and the second potential barrier R is disposed adjacent to the second source/drain electrode 3. In this manner, the second potential barrier R is separated from the first electrode 2 by the first potential barrier Q and the first potential barrier Q is separated from the second electrode 3 by the second potential barrier R with respect to X axis which connects the two source/drain electrodes.

The first potential barrier Q is configured to be opposed to the passage of the electric charges emitted by the first source/drain electrode 2 towards the second electrode 3. The second potential barrier R is configured to be opposed to the passage of the electric charges emitted by the second source/drain electrode 3 towards the first electrode 2. A potential barrier represents a local minimum or maximum of energy in the conduction band or the valence band.

In this manner, if the first electrode 2 is N-doped, the first potential barrier Q in the conduction band is opposed to the passage of the electrons emitted by the electrode 2 towards the second electrode 3 and the second potential barrier R in the valence band is opposed to the passage of the electron holes emitted by the second electrode 3 towards the first electrode 2.

If the first electrode 2 is P-doped, the first potential barrier Q in the valence band is opposed to the passage of the electron holes emitted by the electrode 2 towards the second electrode 3 and the second potential barrier R in the conduction band is opposed to the passage of the electrons emitted by the second electrode 3 towards the first electrode 2.

The first generation device and/or the second generation device comprise a variable-amplitude biasing circuit. In this manner, the amplitude of the first potential barrier and/or of the second potential barrier can be modulated according to the instruction applied by the associated biasing circuit. This modulation of one of the potential barriers allows to define the quantity of current passing through the transistor and thus to define an on-state and an off-state.

The first and second potential barriers can be obtained by means of various techniques, for example by means of various electrostatic control devices which are disposed facing the inter-electrode area, i.e. in order to cover at least partially the inter-electrode area in the direction of X axis connecting the two electrodes 2 and 3.

In a preferential embodiment illustrated in FIG. 1, the device for generating the first barrier Q comprises a biasing circuit 9 of the gate electrode 1. The biasing circuit 9 of the gate electrode 1 is then configured so as to generate, opposite the gate electrode 1, the first potential barrier Q. This potential barrier tends to be opposed to the passage of the charge carriers emitted by the nearest source/drain electrode. In this manner, the distribution of the potentials in the semiconductor film 4 tends to reduce the probability that an electric charge transits between the source and drain electrodes. It is also possible, in an opposite configuration, to consider that the biasing circuit 9 of the gate electrode 1 is configured so as to generate, opposite the gate electrode, the second potential barrier R, which has been said for the first barrier can be applied to the second barrier and conversely.

Thus, when the gate electrode 1 is adjacent to the first source/drain electrode 2, i.e. when the gate electrode 1 is closer to the first electrode 2 than to the second electrode 3, two scenario are possible. The biasing circuit 9 of the gate electrode 1 is configured so that the potential of the gate electrode 1 is lower than the potential of the first electrode 2 when the first electrode is P-doped. The biasing circuit 9 of the gate electrode 1 is configured so that the potential of the gate electrode 1 is higher than the potential of the first electrode 2 when the first electrode 2 is N-doped.

In the rest of the description, the gate electrode 1 is considered adjacent to the first electrode 2 as it is represented in the various Figures, but it is also possible to have the gate electrode 1 adjacent to the second electrode 3, which involves a position switch of the various elements described.

In this embodiment, the other potential barrier (here, the second potential barrier) can be preferentially defined with controlling means applying a bias to the substrate 6 (FIG. 1), for example a constant bias. The other potential barrier can also be defined by modulating the properties of the energy bands by means of fixed electric charges disposed near the semiconductor film or by modulating the properties of the energy bands in the inter-electrode area.

In a particular embodiment illustrated in FIG. 1, the other potential barrier comes from electric charges present at the interface between the semiconductor film 4 and a covering insulating film 10 or present in the electrically insulating film 10. The covering insulating film 10 covers at least partially the area located between the gate electrode 1 and the second electrode 3. This electrically insulating material comprises trapped electric charges while being still electrically insulating. It is still possible to place pending chemical bonds at the interface with the film 4 so as to generate electric charges. The selected deposition method allows to modulate the quantity of electric charges present at the interface. For example, it is possible to deposit a silicon oxide comprising positive electric charges by means of a chemical vapor deposition. In this case, there are two devices for modulating the level of the energy bands in the semiconductor film 4 by electrostatic effect. These two electrostatic controls are opposite the inter-electrode area and they are shifted, in the direction of X axis, from one another in order to generate two distinct potential barriers. One of the electrostatic controls is variable in amplitude, the gate electrode 1. The other electrostatic control is constant as it can be the case with the electric charges associated with the covering film 10. The other electrostatic control does not require any current, which is advantageous for the power consumption of the device. The two electrostatic controls are on the same side of the film 4.

Figure 2:
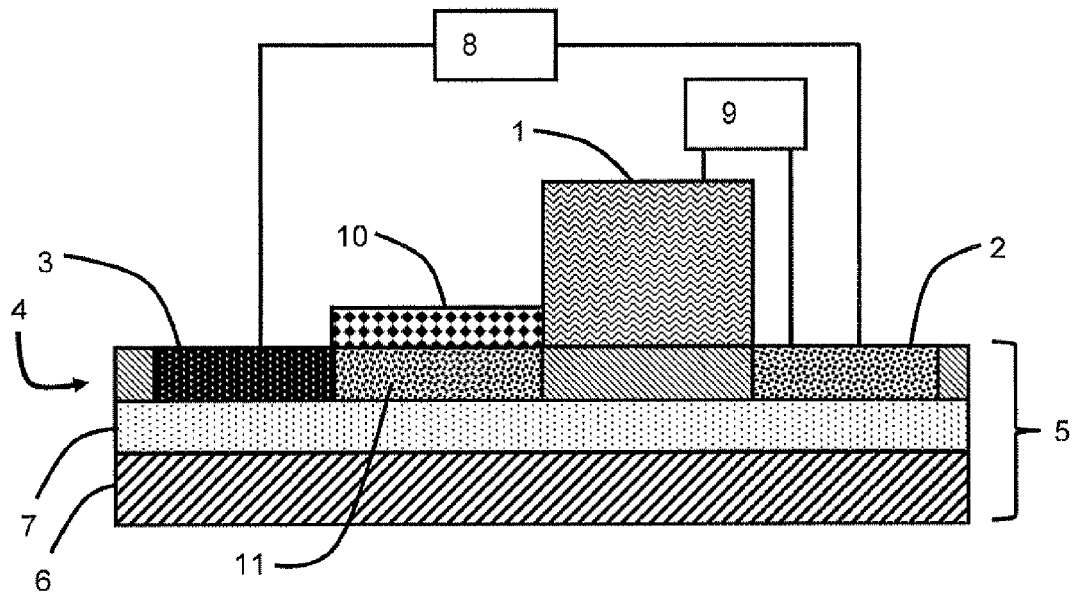

In an alternative embodiment of the preceding embodiment illustrated in FIG. 2, the second potential barrier is introduced partly by means of an additional doped area 11 located under the covering film between the two source/drain electrodes 2 and 3 in the semiconductor film 4. The additional doped area 11 is disposed near the source electrode or the drain electrode and its doping type is selected so as to form a PN junction with the nearest electrode. Thus, the additional area 11 is of N type if it is placed near the P-doped electrode. On the contrary, the additional area 11 is of P-type if it is placed near the N-doped electrode. Using the doped area 11 allows to reduce the variability of the value of the barrier by using a material whose position of the conduction and valence bands are known. Using the area 11 also allows to avoid using a biasing source in order to form the second potential barrier.

In a general way, the doped area 11 comprises a doping of the type opposite that of its nearest electrode so as to form a PN junction in the same direction as the PN junction formed by the first electrode 2 and the second electrode 3. The structure of the semiconductor film can be, from the electrode 2 to the electrode 3, of the type PIPN, NINP.

Figure 3:
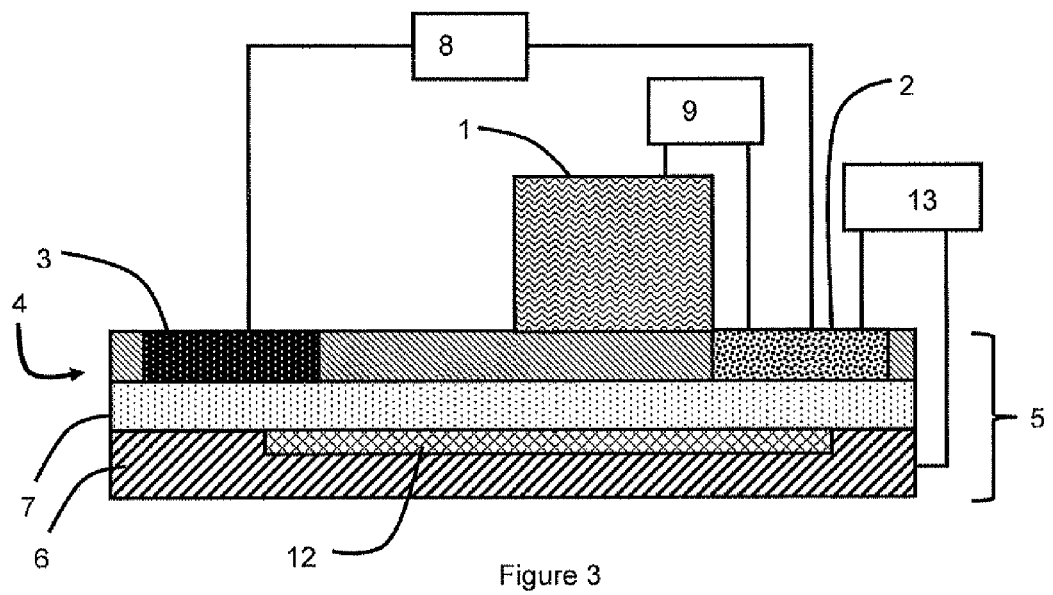

In another preferential embodiment illustrated in FIG. 3 which can be combined with the preceding embodiments, the substrate comprising the field-effect device is a substrate 5 of the semiconductor on insulator type with a counter-electrode 12. The counter-electrode 12 is separated from the semiconductor film 4 by the electrically insulating layer 7. The counter-electrode 12 is facing at least a part of the inter-electrode area. The counter-electrode 12 can also facing at least a part of the gate electrode 1. The device then comprises a biasing circuit 13 of the counter-electrode 12 which is configured so as to generate a potential difference between the first electrode 2 and the counter-electrode 12 which has the same sign as the existing potential difference between the first electrode 2 and the gate electrode 1, whether the first electrode 2 is P-doped P or N-doped. In a preferential way, the covering area between the counter-electrode 12 and the gate electrode 1 are reduced in order to facilitate the formation and the control of the two potential barriers. In an even more preferential way, the device has no covering area between the gate electrode 1 and the counter-electrode 12.

Using a counter-electrode 12 allows to obtain a compact device because the shift between the gate electrode 1 and the counter-electrode 12 can be weak even null and the electrostatic interactions between the electrodes are reduced.

In other words, the biasing circuit 13 of the counter-electrode 12 is configured to present a potential difference between the N-doped electrode and the counter-electrode 12 which has the same sign as the potential difference between the N-doped electrode and the gate electrode 1 when the gate electrode 1 is located on the N side. The biasing circuit 13 of the counter-electrode 12 is configured to present a potential difference between the P-doped electrode and the counter-electrode 12 which has the same sign as the potential difference between the P-doped electrode and the gate electrode 1 when the gate electrode 1 is located on the P side.

The biasing circuit 13 can be connected directly to the counter-electrode 12 or, for example, the connection can be carried out by means of the substrate 6.

The counter-electrode 12 can face the gate electrode 1. There is a difference in dimension between the two electrodes 1 and 12 in the direction of the axis X so as to be able to generate two potential barriers which are shifted with respect to the axis X and which are oriented in opposite directions of potential.

The counter-electrode 12 can still be shifted with respect to the first gate electrode 1 in order to reduce, even to avoid, a covering of the electrostatic forces applied.

The counter-electrode 12 is advantageously submitted to a constant bias.

In an alternative embodiment, the counter-electrode 12 can be replaced by a second covering film. The second covering film can be separated from the film 4 by the electrically insulating layer 7. The second covering film can also be formed in the electrically insulating layer.

In another alternative embodiment which can be combined with the preceding one, the counter-electrode 12 can be replaced by a doped area of the support substrate 6. The doping type and level are configured so as to generate the second potential barrier. The doping of the substrate 6 and/or counter-electrode 12 enables to modify the flat-band voltage at the interface between the semiconductor film 4 and the electrically insulating layer 7 so that the second potential barrier can be generated intrinsically without using the counter-electrode 12 or a non-zero bias on the substrate 6.

Figure 4:
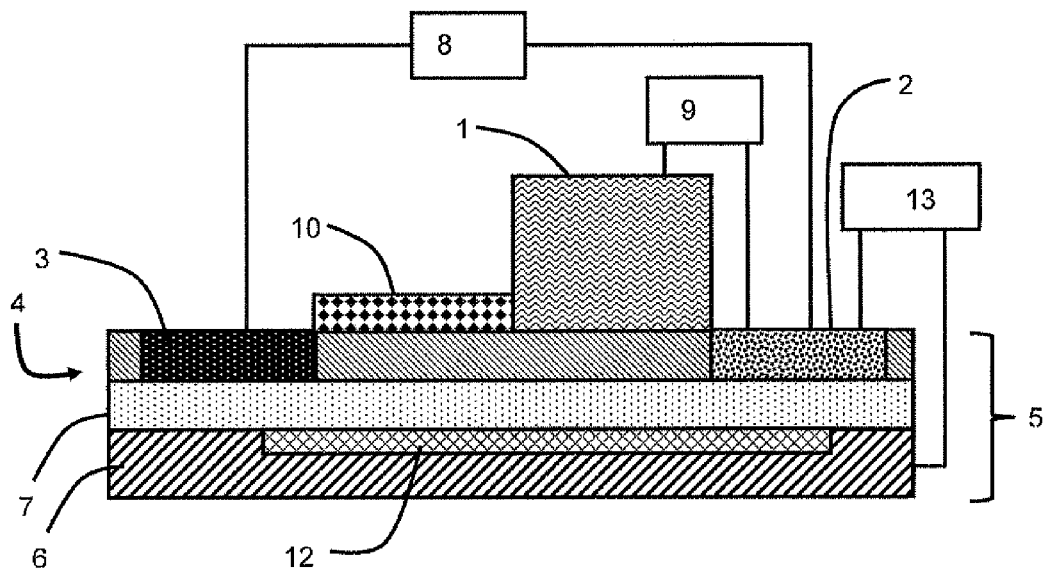

As an example, FIG. 4 illustrates the combination of the embodiment with the covering film in FIG. 1 and the embodiment with the counter-electrode 12 in FIG. 3. This embodiment allows to have a second constantly present potential barrier and to modulate the amplitude of this second potential barrier by means of the counter-electrode 12.

Figure 5:
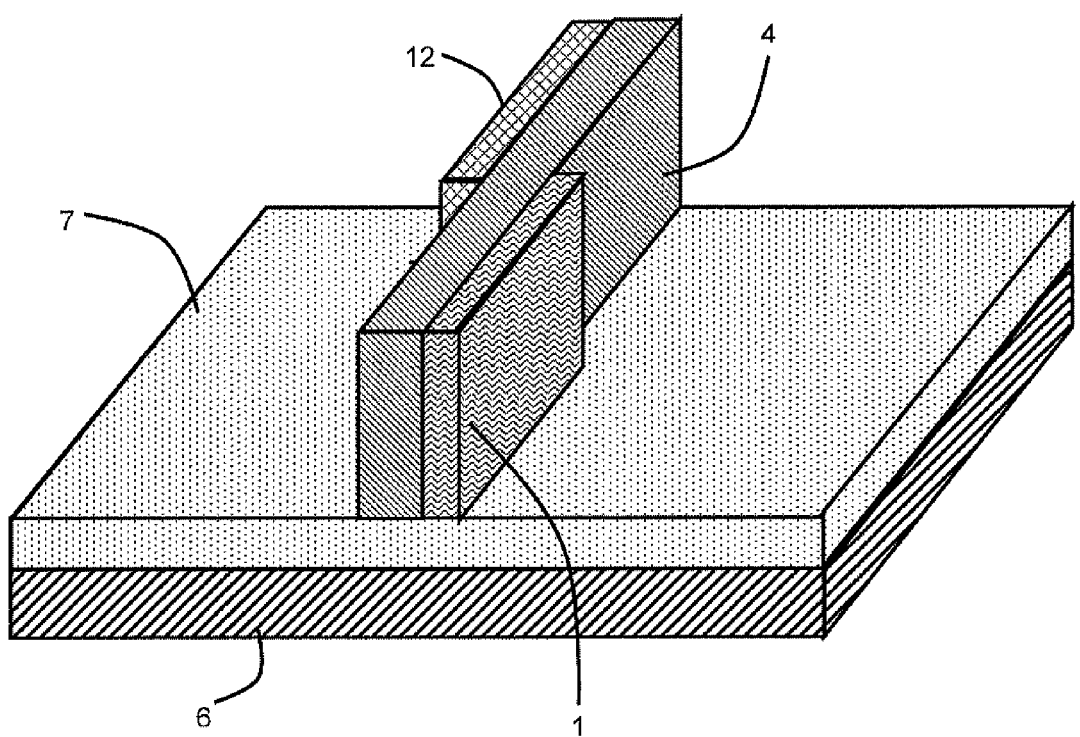

In another embodiment illustrated in FIG. 5, the first device for generating the first potential barrier Q in the semiconductor film 4 and the second device for generating the second potential barrier R in the semiconductor film 4 are disposed on both sides of the semiconductor film 4.

The semiconductor film 4 is a pattern protruding from an electrically insulating film. The electrically conducting film comprises two opposite main faces and at least one side face which connects the two main faces. The side face has an interface with the electrically insulating layer 7. The device can thus be formed on a substrate of semiconductor on insulator type but in a different configuration from that represented in FIG. 3. Whereas the preceding embodiments allowed a co-integration with transistors according to a so-called "planar" architecture, this last embodiment allows the co-integration with transistors according to a so-called "Fin-Fet" architecture. The difference between this type of device and a conventional transistor comes from the doping of the source and drain electrodes and in the covering surface of the gate electrode.

It is also possible to make the field-effect transistor with a so-called "double gate" architecture, for example by means of a semiconductor channel which is suspended or disposed above the semiconductor substrate. The two gates are separated by the semiconductor film 4. In this scenario, the substrate of the semiconductor on isolator type is not compulsory. Like in the preceding embodiment, the difference between this type of device and a conventional transistor comes from the doping of the source and drain electrodes and in the covering area of the gate electrode.

The gate electrode 1 is formed on one of the main faces and the second device for generating the second potential barrier R is formed on the other main face. The second device can be formed by the covering film 10 or, advantageously, by a second gate electrode which works as a counter-electrode 12.

In this embodiment, there is a great freedom in the choice of the material forming the gate dielectric as well as in the thickness formed.

The embodiments, previously mentioned and illustrated for example in FIGS. 1 and 2, can be combined with this embodiment. The two devices for generating the potentials barriers can be on the same side of the film 4, i.e. on the same main face or on opposite main faces.

The amplitude modulation of one of the two potential barriers allows to control the quantity of current passing through the transistor. The amplitude modulation in the two barriers also allows to obtain this effect and to define the passage between the off- and on-states. The device takes advantage of the positive feedback which exists between the two potential barriers. Thus, when the amplitude of one of the potential barriers decreases (in absolute value), the amplitude of the other potential barrier also decreases.

The first and second potential barriers generated in the semiconductor film prevent the charge carriers from passing between the first and second electrodes 2 and 3. In this configuration, a very low current (current in the OFF state) flows between the first and second electrodes, i.e. a parasitic current.

The amplitude modulation of the first barrier can be obtained by means of the potential applied to the gate electrode 1 or by means of the potential applied to the counter-electrode 12 or by a combination of these two parameters.

It is also possible to have a fixed potential difference between the gate electrode 1 and the counter-electrode 12, the amplitude modulation of the barrier being only obtained by means of the counter-electrode 12 in the area not covered by the gate electrode 1. The counter-electrode then works as a gate electrode which generates a first potential barrier. There is moreover a device for generating a second potential barrier which is opposed to the electrostatic effect induced by the counter-electrode 12.

In still another alternative embodiment, not represented, the gate electrode 1 is disposed near the two source/drain electrodes, which allows to generate a first potential barrier in the film 4 between the two electrodes 2 and 3. The counter-electrode 12 is disposed near one of the two electrodes in order to generate the second potential barrier.

In the particular embodiments illustrated in FIGS. 1 to 5, the area which separates the first source/drain electrode 2 from the second source/drain electrode 3 is not completely covered by the gate electrode 1. Thus, with respect to an axis X which connects the two source/drain electrodes, a part of the distance travelled by the charge carriers is covered by the gate electrode 1 and another part is devoid of this covering so that this other part is not submitted to the electrostatic effect coming from the gate electrode 1. In this manner, there exists above the area defined by the source and drain electrodes, a portion covered by the gate electrode 1 and a portion which is covered by a dielectric material without the gate electrode 1 or a part which is not covered by a material in a solid or fluid state. The structure is called asymmetrical because the gate electrode 1 is not disposed at the same distance from the two source/drain electrodes 2 and 3 in a top view or a sectional view. It is the same when the counter-electrode 12 does not cover all the inter-electrode distance or when it is not disposed at the same distance between the two electrodes 2 and 3.

In a preferential way, the gate electrode 1 is located above the inter-electrode area so that one of its side walls is immediately adjacent to one of the two source/drain electrodes or so as to slightly cover the first electrode 2. In this configuration, one of the side walls of the gate electrode is aligned with the interface between the first electrode 4 and the inter-electrode area. This particular configuration allows to obtain a good compactness of the transistor.

The gate electrode 1 is thus located on the N side of the device (i.e. in the immediate vicinity of the N-doped electrode) or on the P side of the device (i.e. in the immediate vicinity of the P-doped electrode).

Figure 7:
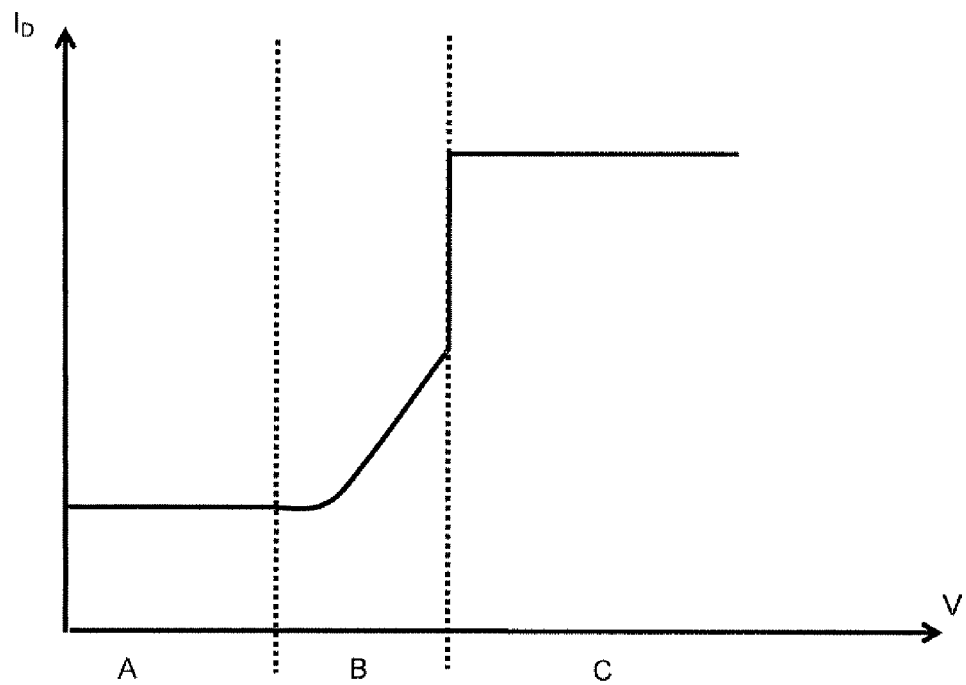

FIG. 6 represents the evolution of the potential of the valence band or the conduction band inside the transistor for several bias conditions. FIG. 7 represents the current $I_D$ which circulates between the first electrode 2 and the second electrode 3 according to the potential difference applied, for example, between the first electrode 2 and the gate electrode 1.

FIG. 6 represents the valence band or the conduction band in the first source/drain electrode 2, in the first potential barrier Q, in the second potential barrier R and in the second source/drain electrode 3. FIG. 6 will be described by considering that the expression "energy band" refers to the valence band or the conduction band according to the type of carrier considered. The illustrated example corresponds to a gate electrode 1 placed near a first N-doped electrode 2. The values of the potentials are reversed if the first electrode 2 is P-doped.

The potential difference applied between the first source/drain electrode 2 and the second source/drain electrode 3 is configured so as to pass the diode, in a forward state, between the two electrodes 2 and 3, which results in bringing together the potential levels of the energy band between the first and the second electrodes. In this case, the potential applied to the second electrode 3 is higher than the potential applied to the first electrode 2. In the example in FIG. 6, the levels of the energy band are identical for the two source/drain electrodes.

The potential applied to the gate electrode 1 generates the first potential barrier Q which is opposed to the migration of the electrons towards the P-doped electrode 3. The second potential barrier is in the opposite direction and it is opposed to the migration the electron holes from the P-doped electrode 3 to the N-doped electrode 2. This situation is represented schematically by curve A.

In this configuration, a very low current circulates between the two source/drain electrodes as it is represented in the part A in FIG. 7.

The potential applied to the gate electrode 1 varies so as to reduce the amplitude of the first potential barrier Q, which involves an increase in the passage probability for the charges emitted by the first electrode 2 and thus a slight increase in the current value. The charges emitted by the first electrode 2 reach the second electrode 3, which modifies the value of the amplitude of the potential barrier R, it allows the emission of electric charges in the other direction. This reduction in the amplitude of the two potential barriers is represented by curve B.

As it is illustrated in the part B in FIG. 7, as the value of the amplitude of the first potential barrier decreases, the value of the current $I_D$ circulating inside the transistor increases. From a moment when the potential of the gate 1 reaches a threshold value, the electric charges emitted by the first electrode and passing the first potential barrier Q are able to create a potential drop at the second electrode 3, which induces a fast reduction in the amplitude of the second potential barrier R and an important current from the second electrode 3 to the first electrode 2. Each of the two currents of electric charges leads to a reduction in the two potential barriers so that an important current suddenly starts to circulate inside the transistor as it is represented in the area C in FIG. 7.

As it is can be seen in FIG. 6, when the current passes through the transistor in an on-state, the potential barriers Q and R are reduced in amplitude.

Electrical measurements were carried out on a device and the parasitic current measured in an off-state is inferior or equal to $10^{-11}$ A/µm (mode A). The current circulating in an on-state (mode C) varies between $10^{-8}$ and $10^{-3}$ A/µm according to biasing conditions for the diode. The subthreshold slope for this particular architecture is much lower than what is classically measured for the conventional transistors. The digital simulations show that the device with a double potential barrier can be miniaturized down to at least a length of the inter-electrode area equal to 30 nm and a thickness of the film 4 equal to 10 nm. The bias voltage at the transistor terminals is equal to or about 1V.

In addition, the transistor works when the diode is forward biased and the flow of charge carriers is controlled by means of two potential barriers of opposite directions. When it is used, the transistor does not work by impact ionization or tunnel effect, two phenomena that are harmful for a good performance of the device over time.

The transistor obtained is thus a transistor with no impact ionization and with an extremely reduced subthreshold slope, called $Z^2$FET for "zero impact ionization and zero swing Field Effect Transistor".

The invention claimed is:

1. Field-effect transistor comprising:
    a first source/drain electrode formed in a film made of semiconductor material by a first N-doped area,
    a second source/drain electrode formed in the film made of semiconductor material by a second P-doped area,
    an inter-electrode area formed in the film made of semiconductor material and separating the two source/drain electrodes,
    a gate electrode partially covering the inter-electrode area,
    a circuitry for applying a first potential difference between the first source/drain electrode and the second source/drain electrode configured to polarize the P-doped electrode to a potential higher than that of the N-doped electrode,
    a first generator of a first potential barrier in the film made of semiconductor material, the first potential barrier being opposed to the passage of charge carriers emitted by the first source/drain electrode,
    a second generator of a second potential barrier in the film made of semiconductor material, the second potential barrier being opposed to the passage of charge carriers emitted by the second source/drain electrode, the second potential barrier being shifted from the first potential barrier with respect to an axis connecting the two source/drain electrodes,
    wherein one of the first and second generators of potential barrier is configured to generate a potential barrier having a variable amplitude and is electrically connected to the gate electrode, the other of the first and second generators of potential barrier is electrically connected to a counter-electrode separated from the gate electrode by the film made of semiconductor material.

2. Transistor according to claim 1, wherein the film made of semiconductor material is separated from a support substrate by an electrically insulating film, the gate electrode being separated from the support substrate by the electrically insulating film.

3. Transistor according to claim 2, wherein the film made of semiconductor material forms a pattern protruding from the electrically insulating film, the protruding pattern comprises two opposite main faces linked by a side face having an interface before the electrically insulating film, the gate electrode being disposed on one of the main faces.

4. Transistor according to claim 1, wherein the other of the first and second generators of the potential barrier comprises a covering insulating film configured so as to present electric charges at the interface between the covering insulating film and the semiconductor film or in the covering insulating film.

5. Transistor according to claim 4, wherein the other of the first and second generators of the potential barrier comprises an additional doped area formed in the film made of semiconductor material and facing the covering insulating film, the additional doped area forming a PN or NP junction at the interface with one of the two source/drain electrodes.

6. Transistor according to claim 1, wherein the counter-electrode covers all the inter-electrode area.

7. Transistor according to claim 1, wherein a circuitry for biasing the gate electrode is configured to apply a potential difference between the first source/drain electrode and the gate electrode which has the same sign as the potential difference between the first source/drain electrode and the second source/drain electrode.

* * * * *